United States Patent
Ou et al.

(10) Patent No.: US 7,390,715 B2
(45) Date of Patent: Jun. 24, 2008

(54) METHOD OF FABRICATING ACTIVE LAYER THIN FILM BY METAL CHALCOGENIDE PRECURSOR SOLUTION

(75) Inventors: Chun-Yao Ou, Hsinchu (TW); Hua-Chi Cheng, Cyonglin Township, Hsinchu County (TW); Ming-Nan Hsiao, Tai Chung (TW); Bor-Chuan Chuang, Tai Nan Hsien (TW); Chao-Jen Wang, Hsinchu (TW)

(73) Assignees: Taiwan TFT LCD Association, Hsinchu (TW); Chunghwa Picture Tubes, Ltd., Taoyuan (TW); Au Optronics Corp., Hsinchu (TW); Quanta Display Inc., Tao Yuan Shien (TW); Hannstar Display Corp., Taipei (TW); Chi Mei Optoelectronics Corp., Tainan County (TW); Industrial Technology Research Institute, Hsinchu (TW); Toppoly Optoelectronics Corp., Miao-Li County (TW)

( * ) Notice: Subject to any disclaimer, the term of this patent is extended or adjusted under 35 U.S.C. 154(b) by 165 days.

(21) Appl. No.: 11/446,300

(22) Filed: Jun. 5, 2006

(65) Prior Publication Data
    US 2007/0238247 A1    Oct. 11, 2007

(30) Foreign Application Priority Data
    Apr. 11, 2006    (TW)    .............................. 95112834 A

(51) Int. Cl.
    *H01L 21/336* (2006.01)
(52) U.S. Cl. .......................... 438/257; 438/85; 438/97; 257/214
(58) Field of Classification Search .................. 438/85, 438/97, 257, 679; 257/214, 298, E29.324
    See application file for complete search history.

(56) References Cited

U.S. PATENT DOCUMENTS

| 6,709,887 B2 * | 3/2004 | Moore et al. .................. 438/95 |
| 2005/0009225 A1 | 1/2005 | Mitzi et al. |
| 2005/0158909 A1 | 7/2005 | Milliron et al. |

* cited by examiner

*Primary Examiner*—Phuc T. Dang
(74) *Attorney, Agent, or Firm*—Rabin & Berdo, P.C.

(57) ABSTRACT

A method of fabricating an active layer thin film by a metal-chalcogenide precursor solution is provided, including the steps of: synthesizing a metal-chalcogenide precursor containing benzyl or benzyl derivative; dissolving the precursor in a solvent to produce a precursor solution, wherein a chalcogen element or compound can be added to the precursor solution to adjust the molar ratio of metal ion to chalcogen; and then applying the precursor solution onto a substrate in a specific coating manner, to form a film of the metal-chalcogenide after a curing process. Thereby, the existing method wherein an amorphous silicon active layer film is fabricated by plasma enhanced chemical vapor deposition (PECVD) is replaced.

18 Claims, 4 Drawing Sheets

METHOD OF FABRICATING ACTIVE LAYER THIN FILM BY METAL CHALCOGENIDE PRECURSOR SOLUTION

BACKGROUND OF THE INVENTION

1. Field of the Invention

The invention relates to a method of fabricating an active layer thin film, more particularly, to a method of fabricating an active layer thin film by a precursor solution.

2. Description of the Prior Art

At present, during the fabrication of liquid crystal displays (LCDs), thin film transistor array (TFT Array) process still uses those technologies similar to the traditional semiconductor manufacturing to form a number of transistors on a glass substrate, for example, through vacuum coating, exposure, yellow development, and etching process, etc. However, as the panel size is gradually increased, the vacuum coating will result in the problems of over high cost but lower yield, etc. In a common bottom-gate thin-film transistor structure presently used, an active layer thin film is formed by Plasma Enhanced Chemical Vapor Deposition (PECVD) to deposit amorphous Si on a gate insulator on a substrate, and then spin-coated with photoresist coating, and patterned by etching after exposure and development.

But, to simplify the process and to reduce the equipment cost, it is the most practicable method that the active layer thin film is fabricated by simply and directly coating with a precursor solution, instead of the vacuum coating. And both the material properties and the process conditions should be considered in the choice and design of a precursor for preparing a precursor solution; wherein, the material properties include, for example, band gap value, Hall mobility, crystallinity, compatibility with metal layer and insulating layer, favorable impedance, and leakage current, etc., and the process conditions include, for example, the coating property, the heat treatment temperature and retention time, etc.

Now, few semiconductor films are fabricated by solution coating, and metal-chalcogenide semiconductors may be suitable under the conditions of band gap value close to that of silicon and non-toxicity. But, in the environmental conditions of non-vacuum and process temperature lower than 300° C., it is rather difficult to fabricate a transistor active layer film having the high mobility as required by the transistor operation with the metal-chalcogenide, since even if a film can be formed under such a condition, the problems of leaving group residues or film quality defects would usually result in the losses of semiconductor properties.

US patent No. 20050158909 disclosed a conventional technology wherein an active layer thin film on a transistor is fabricated by coating with a hydrazine solution of hydrazinium-based metal-chalcogenide precursor.

US patent No. 20050009225 disclosed a conventional technology wherein an active layer thin film on a transistor is fabricated by coating with hydrazine-based metal-chalcogenide precursor dissolved in a non-toxic solvent.

Although in the conventional technologies above, the active layer thin film on a substrate is fabricated by coating with a precursor solution, the hydrazine used is toxic and has a risk of explosion. Furthermore, anhydrous hydrazine must be used in synthesis of the precursor, and it is very difficult to completely remove water content in the hydrazine, which is seldom applied in the industrial production.

SUMMARY OF THE INVENTION

For this, the technical problems to be solved by the present invention are to synthesize a metal-chalcogenide precursor containing benzyl or benzyl derivative, and formulate a solution of the metal-chalcogenide precursor in a solvent. Since the organic metal compound contains benzyl group, which has large molar absorbance in ultraviolet light region, after being coated into a film, the precursor solution of the present invention can directly be cured and patterned simultaneously with laser or ultraviolet light at a wavelength of 100-800 nm. Moreover, according to the invention, toxic solvents are successfully replaced by non-toxic solvents, such as dimethylacetamide, cyclopentanone, and the like, so that toxic solvents (for example, pyridine) are avoided and coating property of the precursor solution is effectively improved.

The present invention provides a method of fabricating an active layer thin film by a metal-chalcogenide precursor solution, including the steps of: firstly synthesizing a precursor which comprises metal-chalcogenide containing benzyl or benzyl derivative; dissolving the precursor in a solvent to produce a desired precursor solution, wherein a chalcogen element or compound can be chosen to add to the precursor solution to adjust the molar ratio of metal ion to chalcogen; and then applying the precursor solution onto a substrate in a coating manner; finally, performing a curing process to form an active layer film on the substrate.

The general description above and the following details as well as the drawings are all used to further illustrate those manners, means, and efficacies employed in the present invention to achieve the desired purposes. And other purposes and advantages of the present invention will be explained in the following descriptions and drawings.

DETAILED DESCRIPTION OF PREFERRED EMBODIMENTS

Figure 1:
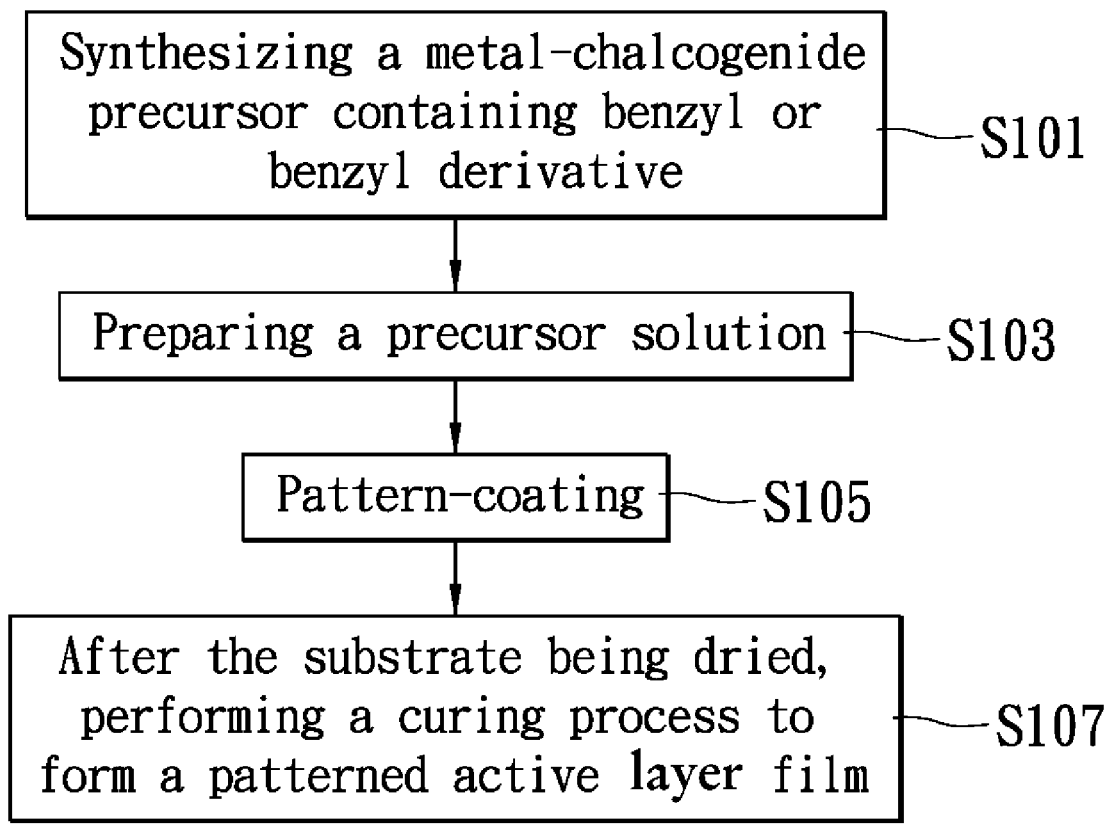
FIG. 1 is a flowchart showing a fabrication process according to a preferred embodiment of the invention.

Refer to FIG. 1, it is a flowchart showing a fabrication process according to a preferred embodiment of the invention. Firstly, a metal-chalcogenide precursor containing benzyl or benzyl derivative is synthesized (step S101), wherein the metal-chalcogenide precursor containing benzyl or benzyl derivative has the general formula of $(R_1R_2R_3R_4R_5-C_6H_3-CH_2-)_{nh-2i}M_hX_i$; wherein $R_1$, $R_2$, $R_3$, $R_4$, and $R_5$ are each independently a functional group, M denotes an n-valent metal and n is an integer of 1-6, X denotes a chalcogen element, h is an integer of 1-10, and i is an integer of 0-30; wherein the $R_{1-5}$ groups are selected from hydrogen, aromatic, ester, ether, carboxylic acid, sulfonic acid, aldehyde, hydroxyl, ketone, imine, amide, methyl or ethyl group, and a branched or cyclic aliphatic group containing 3 to 6 carbons, and the metal is germanium(Ge), antimony(Sb), tin(Sn), lead (Pb), bismuth(Bi), gallium(Ga), indium(In), or thallium(Ti). And then, the precursor is dissolved in a solvent to produce a precursor solution (step S103), wherein a chalcogen element or compound can be added to the precursor solution to adjust the molar ratio of metal ion to chalcogen therein; wherein the chalcogen element is sulfur, selenium, or tellurium, or a mixture thereof, and the solvent may be selected from aromatics, aliphatics, esters, ketones, alcohols, amides, amines, imines, sulfonamides, or a mixture thereof. Thereafter, the precursor solution is pattern-coated on a suitable substrate in a coating manner (step S105), such as roller coating, ink jet printing, screen printing, or imprinting, and the like. After the substrate is dried through a hot plate, a curing process is performed to form a patterned active layer film on the substrate (step S107) for use in a semiconductor element. The curing process can be performed by direct pattern, ultraviolet curing, or thermal curing to cure the existing patterned region; and the semiconductor element may be, for example, an active element, thin film transistor, solar cell, radio-frequency identification element (RFID), integrated circuit, or optical communication element, and the like.

Figure 2:
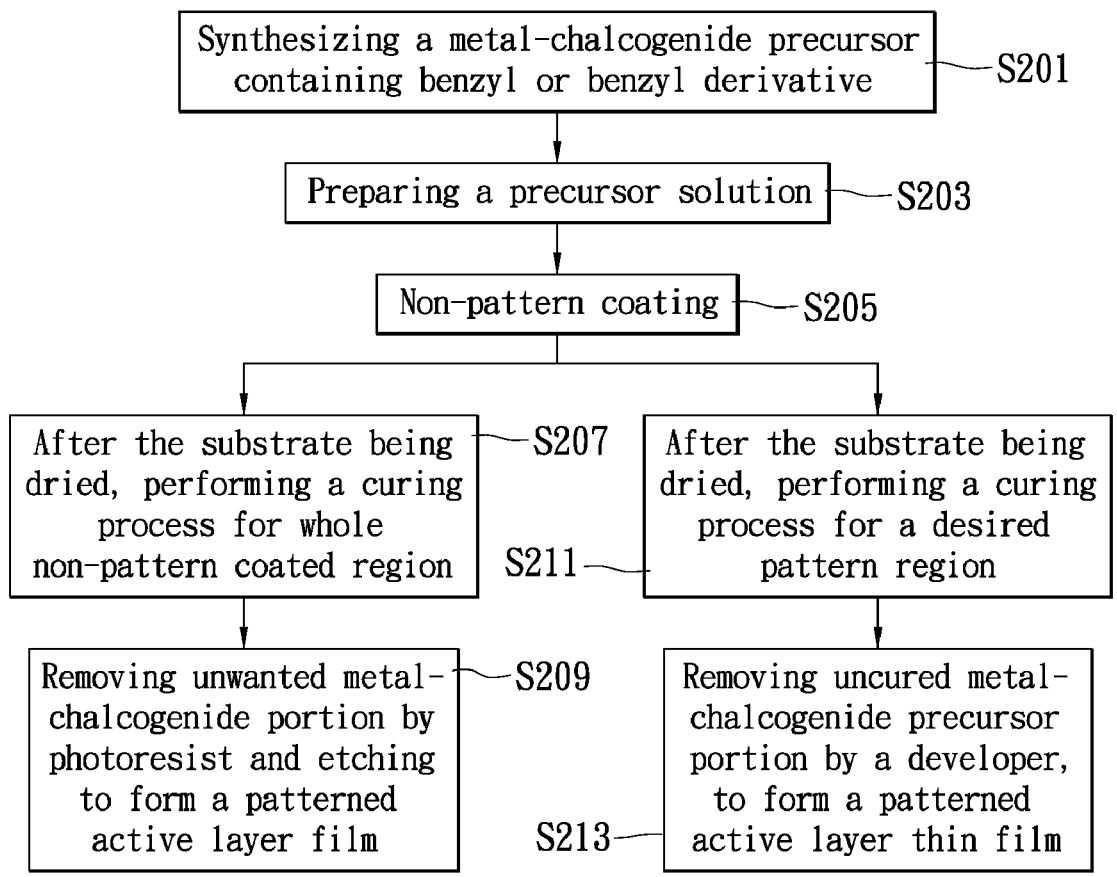
FIG. 2 is a flowchart showing a fabrication process according to another preferred embodiment of the invention.

Refer to FIG. 2, it is a flowchart showing a fabrication process according to another preferred embodiment of the invention. Firstly, a metal-chalcogenide precursor containing benzyl or benzyl derivative is synthesized (step S201), wherein the metal-chalcogenide precursor containing benzyl or benzyl derivative has the general formula of $(R_1R_2R_3R_4R_5-C_6H_3-CH_2-)_{nh-2i}M_hX_i$; wherein $R_1$, $R_2$, $R_3$, $R_4$, and $R_5$ are each independently a functional group, M denotes an n-valent metal and n is an integer of 1-6, X denotes a chalcogen element, h is an integer of 1-10, and i is an integer of 0-30; wherein the $R_{1-5}$ groups are selected from hydrogen, aromatic, ester, ether, carboxylic acid, sulfonic acid, aldehyde, hydroxyl, ketone, imine, amide, methyl or ethyl group, and a branched or cyclic aliphatic group containing 3 to 6 carbons, and the metal is germanium(Ge), antimony(Sb), tin (Sn), lead(Pb), bismuth(Bi), gallium(Ga), indium(In), or thallium(Ti). And then, the precursor is dissolved in a solvent to produce a precursor solution (step. S203), wherein a chalcogen element or compound can be added to the precursor solution to adjust the molar ratio of metal ion to chalcogen therein; wherein the chalcogen element is sulfur, selenium, or tellurium, or a mixture thereof, and the solvent may be selected from aromatics, aliphatics, esters, ketones, alcohols, amides, amines, imines, sulfonamides, or a mixture thereof.

Thereafter, the precursor solution is non-pattern-coated on a substrate in a coating manner (step S205), such as spin coating, roller coating, ink jet printing, slot die coating, screen printing, or imprinting, and the like. After the non-pattern coating, an active layer thin film can be formed, for example, through the following two ways. One is that after the substrate is dried through a hot plate, a curing process is performed by photo or thermal curing to directly cure the whole non-pattern coated region (step S207), and then photoresist and etching is utilized to remove unwanted metal-chalcogenide portion, forming a patterned active layer film (step S209). The other is that after the substrate is dried through a hot plate, a curing process is performed by a photomask in combination with laser or ultraviolet curing to only cure a desired pattern region (step S211), and then a developer is utilized to remove uncured metal-chalcogenide precursor portion, forming a patterned active layer thin film (step S213). Finally, the patterned active layer thin film is applied to a semiconductor element, such as, active element, thin film transistor, solar cell, radio-frequency identification element (RFID), integrated circuit, or optical communication element, and the like.

Figure 3:
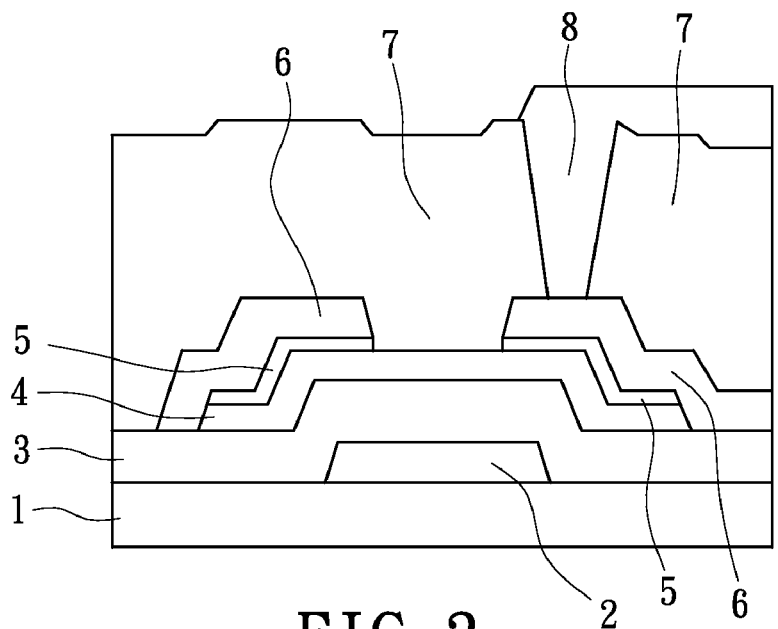
FIG. 3 is a sectional view showing the use in a bottom-gate thin-film transistor according to the invention.

Refer to FIG. 3, it is a sectional view showing the use in a bottom-gate thin-film transistor according to the invention. In a presently common bottom-gate thin-film transistor structure, an active layer thin film is formed by Plasma Enhanced Chemical Vapor Deposition (PECVD) to deposit amorphous Si on a gate insulator, and then coating photoresist is performed by spin coating, and after exposure and development, a pattern is obtained by etching. And in the present invention, a metal-chalcogenide precursor solution is pattern-coated on a gate insulator 3 formed on a substrate 1, then a photo or thermal curing (laser direct pattern) is performed to fabricate a semiconductor layer 4 of an active layer thin film and a positively charged semiconductor layer 5 of an active layer thin film having material nature close to that of amorphous silicon, which are insulating for a first conductive layer 2 through the gate insulator 3. A passivation layer 7 is further set on a second conductive layer 6 to insulate from outside, and a third conductive layer 8 is used to connect with outside. In addition, for the positively charged semiconductor layer 5 of an active layer thin film, after being non-pattern coated and cured, unwanted pattern region is removed by laser direct pattern.

Non-limiting exemplifications below are only used to further illustrate embodiment aspects of the present invention.

Figure 4:
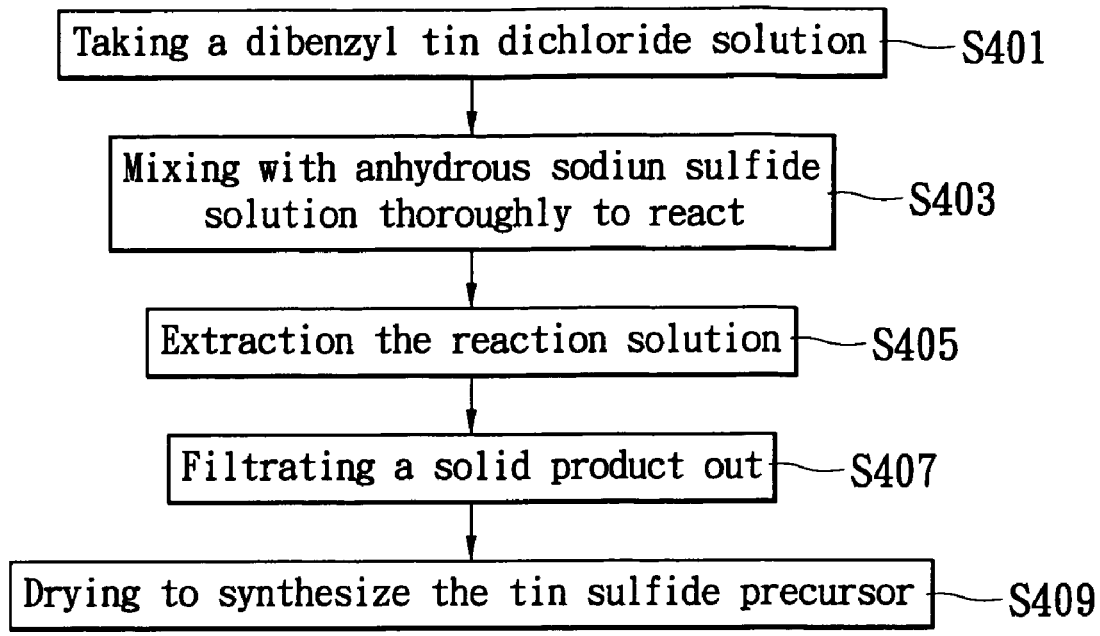
FIG. 4 is a flowchart showing a synthesis process of a tin sulfide precursor containing benzyl group according to an embodiment of the invention.

Refer to FIG. 4, it is a flowchart showing a synthesis process of a tin sulfide precursor containing benzyl group according to an embodiment of the invention. It can be seen in the FIG. 4 that, a dibenzyl tin dichloride/THF solution (step S401) is firstly take, and then added drop-wise to anhydrous sodium sulfide/THF solution with magnetic stirring at 30° C., and after this, the mixture solution is continually stirred for thorough mixing to react (step S403). Subsequently, the reaction solution is poured into water, and extracted with diethyl ether; repeat three times (step S405). The extract is concentrated under reduced pressure and filtrated to obtain a solid product (step S407). And then, the solid product is dried in vacuum at room temperature to synthesize the tin sulfide precursor containing benzyl group (2,2,4,4,6,6-hexabenzyl cycloytristannasulfane, $(Bn_2SnS)_3$)(step S409).

Figure 5:
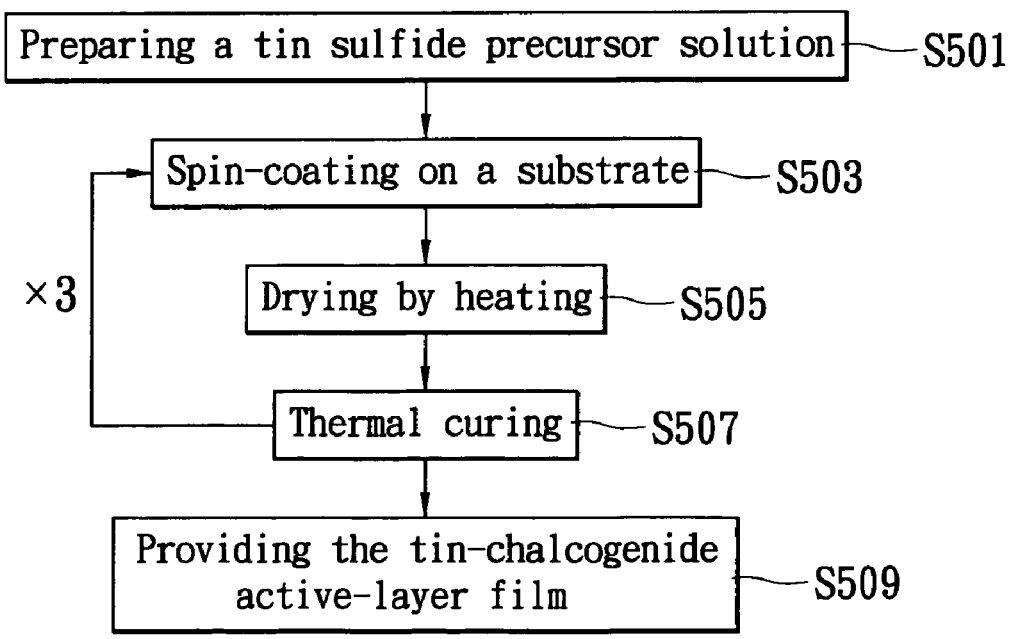
FIG. 5 is a flowchart showing a preparation process of a tin-chalcogenide active-layer film according to an embodiment of the invention.

Refer to FIG. 5, it is a flowchart showing a preparation process of a tin-chalcogenide active-layer film according to an embodiment of the invention. Firstly, the tin sulfide precursor synthesized in the FIG. 4 is taken, mixed simultaneously with chalcogenide dibenzyl disulfide, dibenzyl diselenide, and pyridine as a solvent, and stirred on a hot plate at 60° C. until they are completely be dissolved. After that, the mixture solution is filtrate through a filter, obtaining a precursor solution (step S501). Subsequently, the precursor solution is spin-coated on a substrate (step S503), dried with a hot plate (step S505), and charged into an oven under nitrogen to perform thermal curing (step S507). Repeat (steps S503 to S507) three times, to provide the tin-chalcogenide active-layer film (step S509).

Figure 6:
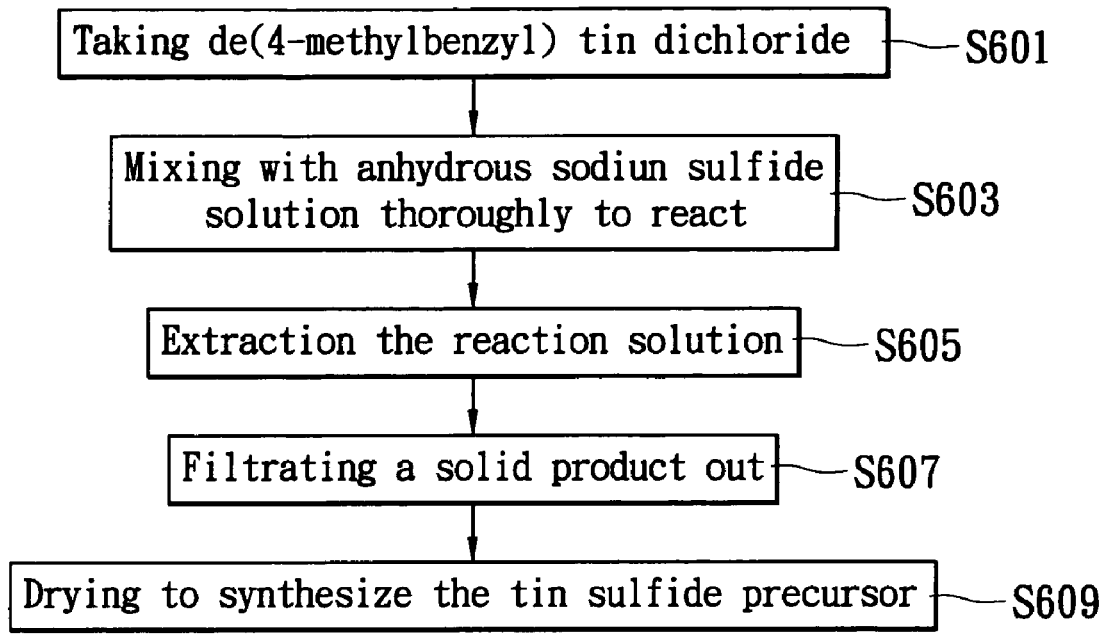
FIG. 6 is a flowchart showing a synthesis process of a tin sulfide precursor containing benzyl derivative according to another embodiment of the invention.

Refer to FIG. 6, it is a flowchart showing a synthesis process of a tin sulfide precursor containing benzyl derivative according to another embodiment of the invention. It can be seen in the FIG. 6 that firstly a di(4-methylbenzyl) tin dichloride)/THF solution is taken (step S601), and then added dropwise to anhydrous sodium sulfide/THF solution with magnetic stirring at 30° C., and after this, the mixture solution is continually stirred for thorough mixing to react (step S603). Subsequently, the reaction solution is poured into water, and extracted with diethyl ether; repeat three times (step S605). The extract is concentrated under reduced pressure and filtrated to obtain a solid product (step S607). And then, the solid product is dried in vacuum at room temperature to synthesize the tin sulfide precursor containing benzyl derivative (2,2,4,4,6,6-hexa(4'-methyl-benzyl) cycloytristannasulfane, $(CH_3-Bn_2SnS)_3$)(step S609).

Figure 7:
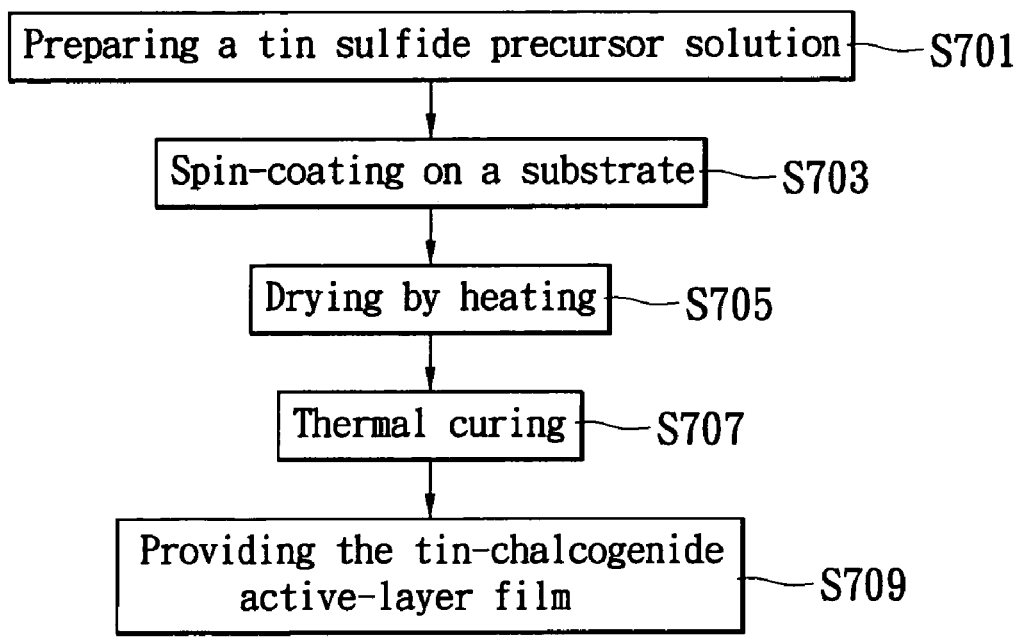
FIG. 7 is a flowchart showing a preparation process of a tin-chalcogenide active-layer film according to another embodiment of the invention.

Refer to FIG. 7, it is a flowchart showing a preparation process of a tin-chalcogenide active-layer film according to another embodiment of the invention. Firstly, the tin sulfide precursor synthesized in the FIG. 6 is taken, mixed simultaneously with chalcogenide dibenzyl disulfide, dibenzyl diselenide, and pyridine as a solvent, and magnetically stirred until they are completely be dissolved. After that, the mixture solution is filtrate through a filter, obtaining a precursor solution (step S701). Subsequently, the precursor solution is spin-coated on a substrate (step S703), dried with a hot plate (step S705), and charged into an oven under nitrogen to perform thermal curing (step S707), to provide the tin-chalcogenide active-layer film (step S709).

In conclusion, with the technical approaches above, the present invention can not only achieve the purposes of reduced equipment cost and simplified process, but also further provide enhanced quality: in the precursor solution of the invention, various properties of the active layer thin film, such as band gap value and mobility etc., can be adjusted by adding other compounds for doping; and it can be well verified that these properties have favorable benefits for reducing starting voltage and improving whole quality. The invention is different from conventional technologies either in materials or in fabrication manner, is considerably valuable for industry application, and conforms to the requirements of novelty and inventive step.

But, the foregoing general descriptions are only illustrative and not to limit the present invention. It will be apparent to those skilled in the art that various modifications and variations can be made without departing from the scope of the invention, which fall within the scope of the following claims.

What is claimed is:

1. A method of fabricating an active layer thin film by a metal-chalcogenide precursor solution, including the steps of:
    Synthesizing a precursor, comprising a metal-chalcogenide containing benzyl or benzyl derivative;
    Dissolving the precursor in a solvent to produce a precursor solution;
    Applying the precursor solution onto a substrate in a coating manner; and
    After the substrate is dried, performing a curing process to form an active layer thin film on the substrate.

2. The method as claimed in claim 1, wherein the metal-chalcogenide precursor containing benzyl or benzyl derivative has the general formula of
    $(R_1R_2R_3R_4R_5-C_6H_3-CH_2-)_{nh-2i}M_hX_i$, wherein
    $R_1, R_2, R_3, R_4$, and $R_5$ are each independently a functional group;
    M denotes an n-valent metal and n is an integer of 1-6;
    X denotes a chalcogen element;
    h is an integer of 1-10; and
    i is an integer of 0-30.

3. The method as claimed in claim 2, wherein the functional group is selected from hydrogen, aromatic, ester, ether, carboxylic acid, sulfonic acid, aldehyde, hydroxyl, ketone, imine, amide, methyl or ethyl group, and a branched or cyclic aliphatic group containing 3 to 6 carbons.

4. The method as claimed in claim 2, wherein the metal is germanium (Ge), antimony (Sb), tin (Sn), lead (Pb), bismuth (Bi), gallium (Ga), indium (In), or thallium (Ti).

5. The method as claimed in claim 1, wherein a chalcogen element or compound can be added to the precursor solution to adjust the molar ratio of metal ion to chalcogen in the precursor solution.

6. The method as claimed in claim 5, wherein the chalcogen element is sulfur, selenium, or tellurium, or a mixture thereof.

7. The method as claimed in claim 1, wherein the chalcogenide is a compound containing sulfur, selenium, or tellurium, or a mixture thereof.

8. The method as claimed in claim 1, wherein the solvent is selected from aromatics, aliphatics, esters, ketones, alcohols, amides, amines, imines, sulfonamides, or a mixture thereof.

9. The method as claimed in claim 1, wherein the coating manner is spin coating, roller coating, ink jet printing, slot die coating, screen printing, or imprinting, so that the precursor solution is directly subjected to a non-pattern whole coating on the substrate.

10. The method as claimed in claim 9, wherein after the non-pattern whole coating, the curing process is performed by utilizing a photo-mask in combination with laser or ultraviolet curing to directly cure a desired pattern region, and then by using a developer to remove uncured metal-chalcogenide precursor portion.

11. The method as claimed in claim 9, wherein after the non-pattern whole coating, the curing process is performed by utilizing photo or thermal curing to cure the whole-coated region.

12. The method as claimed in claim 11, wherein in the cured whole-coated region, unwanted metal-chalcogenide precursor can be further removed by photoresist and etching.

13. The method as claimed in claim 1, wherein the coating manner is roller coating, ink jet printing, screen printing, or imprinting, so that the precursor solution is directly subjected to a pattern-coating on the substrate.

14. The method as claimed in claim 13, wherein after the pattern-coating, the curing process is performed by utilizing laser direct pattern to cure the existing patterned region.

15. The method as claimed in claim 13, wherein after the pattern-coating, the curing process is performed by utilizing ultraviolet curing to directly cure the available pattern region.

16. The method as claimed in claim 13, wherein after the pattern-coating, the curing process is performed by utilizing thermal curing to directly cure the available patterned region.

17. The method as claimed in claim 1, wherein the active layer thin film is applied to a semiconductor element.

18. The method as claimed in claim 17, wherein the semiconductor element is an active element, thin film transistor, solar cell, radio-frequency identification element (RFID), integrated circuit, or optical communication element.

* * * * *